US012740158B2

(12) United States Patent
Zheng et al.

(10) Patent No.: US 12,740,158 B2
(45) Date of Patent: Sep. 15, 2026

(54) SOLAR CELL, METHOD FOR MANUFACTURING THE SAME, AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Lihua Zheng, Haining (CN); Menglei Xu, Haining (CN); Xiu Feng, Haining (CN); Jie Yang, Haining (CN); Xinyu Zhang, Haining (CN)

(73) Assignees: ZHEJIANG JINKO SOLAR CO., LTD., Haining (CN); JINKO SOLAR CO., LTD.

( * ) Notice: Subject to any disclaimer, the term of this patent is extended or adjusted under 35 U.S.C. 154(b) by 0 days.

(21) Appl. No.: 18/980,208

(22) Filed: Dec. 13, 2024

(65) Prior Publication Data

US 2025/0204054 A1 Jun. 19, 2025

(30) Foreign Application Priority Data

Dec. 14, 2023 (CN) ........................ 202311723221.7

(51) Int. Cl.
*H10F 10/14* (2025.01)
*H10F 19/80* (2025.01)
*H10F 77/30* (2025.01)

(52) U.S. Cl.
CPC ............ *H10F 10/14* (2025.01); *H10F 19/80* (2025.01); *H10F 77/311* (2025.01)

(58) Field of Classification Search
CPC ...... H10F 10/14; H10F 10/146; H10F 77/211; H10F 77/14; H10F 77/147
See application file for complete search history.

(56) References Cited

U.S. PATENT DOCUMENTS

2011/0214719 A1* 9/2011 Li ........................ H10F 77/703 257/E31.13
2014/0305501 A1 10/2014 Li et al.
(Continued)

FOREIGN PATENT DOCUMENTS

CN 105 609 571 A 5/2016
CN 214043686 U 8/2021
(Continued)

OTHER PUBLICATIONS

Yang et al., "IBC c-Si Solar Cells Based on Ion-Implanted Poly-Silicon Passivating Contacts", Solar Energy Materials & Solar Cells 158, http://dx.doi.org/10.1016/j.solmat.2016.05.041, pp. 84-90, May 26, 2016.

(Continued)

*Primary Examiner* — Christina Chern
(74) *Attorney, Agent, or Firm* — Ballard Spahr LLP

(57) ABSTRACT

Disclosed are a solar cell, a method for manufacturing the same, and a photovoltaic module. The solar cell includes: a substrate having a front side and back side opposite to each other, a first doped layer and a second doped layer alternately arranged along a first direction on the back side, and a first electrode and a second electrode. The first doped layer and the second doped layer adjacent to the first doped layer are separated by an isolation region. A portion of the back side located at the isolation region is exposed. The first doped layer has a first slope sidewall facing the isolation region, and the second doped layer has a second slope sidewall facing the isolation region.

18 Claims, 10 Drawing Sheets

(56) References Cited

U.S. PATENT DOCUMENTS

2015/0162483 A1 6/2015 Weidman et al.
2017/0179310 A1 6/2017 Westerberg et al.
2025/0143009 A1* 5/2025 Liu ....................... H10F 10/146

FOREIGN PATENT DOCUMENTS

EP 4 195 299 A1 6/2023
EP 4290587 A1 12/2023
JP 2023016702 A 2/2023

OTHER PUBLICATIONS

Extended European Search Report issued Apr. 9, 2025 in EP Application No. 24219794.5 (9 pages).
Office Action for Japanese Application No. 2024-212502 mailed Jan. 21, 2026.

* cited by examiner 110
1111
1112
1113
111
103
104

SOLAR CELL, METHOD FOR MANUFACTURING THE SAME, AND PHOTOVOLTAIC MODULE

CROSS-REFERENCE TO RELATED APPLICATION

The present application claims the priority to Chinese patent application No. 202311723221.7, filed on Dec. 14, 2023, and entitled "SOLAR CELL, METHOD FOR MANUFACTURING THE SAME, AND PHOTOVOLTAIC MODULE", which is incorporated herein by reference in its entirety.

TECHNICAL FIELD

The embodiments of the present disclosure relate to the photovoltaic field, and in particular to a solar cell, a method for manufacturing the same, and a photovoltaic module.

BACKGROUND

At present, with a gradual depletion of fossil energy, solar cells, as a new alternative energy, are becoming more and more widely used. The solar cells are devices that convert sunlight into electrical energy. The solar cells generate carriers based on the photovoltaic principle, and then use electrodes to lead the carriers out, thereby making use of electrical energy effectively.

The existing solar cells mainly include single-layer cells, such as Interdigitated Back Contact (IBC) cells, Tunnel Oxide Passivated Contact (TOPCON) cells, Passivated emitter and rear cells (PERCs), Heterojunction with Intrinsic Thin-layer/Heterojunction Technology (HIT/HJT) cells, and perovskite cells. Arrangements of different film layers and functional limitations are adopted to reduce optical losses and reduce the recombination of photogenerated carriers on a surface of and in the inner part of a silicon substrate to improve the photoelectric conversion efficiency of the solar cell.

However, the light utilization rate of the IBC cell still needs to be improved.

SUMMARY

Embodiments of the present disclosure provide a solar cell, a method for manufacturing the same, and a photovoltaic module, which at least have beneficial effects of improving the light utilization rate of the solar cell.

According to some embodiments of the present disclosure, on one hand, an embodiment of the present disclosure provides a solar cell, including: a substrate having a front side and a back side opposite to each other, a first doped layer and a second doped layer alternately arranged along a first direction on the back side, and a first electrode and a second electrode. The first doped layer and the second doped layer adjacent to the first doped layer are separated by an isolation region. A doping type of the first doped layer is different from a doping type of the second doped layer. A portion of the back side located at the isolation region is exposed. The first doped layer has a first slope sidewall facing the isolation region, and the second doped layer has a second slope sidewall facing the isolation region. The first electrode is in electrical contact with the first doped layer, and the second electrode is in electrical contact with the second doped layer.

In some embodiments, an angle between the first sloped sidewall and a surface of the first doped layer facing the back side is a first angle, and the first angle is an acute angle; and an angle between the second sloped sidewall and a surface of the second doped layer facing the back side is a second angle, and the second angle is an acute angle.

In some embodiments, the first angle is less than or equal to the second angle.

In some embodiments, the first angle in a range from 25° to 60°, and the second angle is in a range from 30° to 65°.

In some embodiments, the portion of the back side exposed uncovered by the isolation region has a textured structure, and the textured structure includes a plurality of pyramid-shaped structures.

In some embodiments, a width of a bottom surface of each pyramid-shaped structure in a direction parallel to the back side is in a range from 2 μm to 4 μm.

In some embodiments, in a direction away from the back side of the substrate, the first slope sidewall includes a first sub-slope sidewall, a platform surface, and a second sub-slope sidewall connected in sequence.

In some embodiments, in a direction perpendicular to the back side of the substrate, a distance between a surface of the first doped layer away from the substrate and the front side of the substrate is greater than a distance between a surface of the second doped layer away from the substrate and the front side of the substrate, and the platform surface is closer to the back side than the surface of the second doped layer away from the substrate is.

In some embodiments, in a direction perpendicular to the back side of the substrate, a thickness of the second sub-slope sidewall is less than a thickness of the first sub-slope sidewall.

In some embodiments, a slope of the second sub-slope sidewall relative to the back side is greater than a slope of the first sub-slope sidewall relative to the back side.

In some embodiments, in a direction perpendicular to the back side of the substrate, a distance between a surface of the first doped layer away from the substrate and the front side of the substrate is less than or equal to a distance between a surface of the second doped layer away from the substrate and the front side of the substrate.

In some embodiments, the first sloped sidewall is a continuous slope.

In some embodiments, the second sloped sidewall is a continuous slope.

In some embodiments, a doping ion in the first doped layer includes a boron ion, and a doping ion in the second doped layer includes a phosphorus ion.

According to some embodiments of the present disclosure, the embodiments of the present disclosure also provide a method for manufacturing a solar cell, including: providing a substrate having a front side and a back side opposite to each other; forming an initial first doped layer on the back side of the substrate; performing a first patterning process on the initial first doped layer to form a plurality of first doped layers arranged at intervals along a first direction, and a sidewall of each first doped layer being an initial first slope sidewall; forming an initial second doped layer on the back side of the substrate, and a doping type of the initial second doped layer being different from a doping type of the first doped layer; performing a second patterning process on the initial second doped layer to form a second doped layer; and forming a first electrode and a second electrode. The first doped layer and the second doped layer are alternately arranged along the first direction on the back side of the substrate. The first doped layer and the second doped layer adjacent to the first doped layer are separated by an isolation region. A portion of the back side located at the isolation region is exposed. The initial first sloped sidewall is processed by the second patterning process to be a first sloped sidewall facing the isolation region, and a sidewall of the second doped layer facing the isolation region is a second sloped sidewall.

In some embodiments, when forming the initial first doped layer, an initial first oxide layer is formed on a surface of the initial first doped layer. Steps of the first patterning process include: patterning the initial first oxide layer by using a first laser processing to form a first oxide layer, and the first oxide layer being located on a surface of the first doped layer away from the substrate; and removing the initial first doped layer uncovered by the first oxide layer by using a first wet etching process. Before forming the first electrode and the second electrode, the method further includes removing the first oxide layer.

In some embodiments, a laser power of the first laser processing is in a range from 20 W to 30 W, and a process time of the first wet etching process is in a range from 500 s to 1000 s.

In some embodiments, in a step of forming the initial second doped layer, the initial second doped layer is also located on a surface of the first doped layer, and an initial second oxide layer is also formed on a surface of the initial second doped layer away from the back side of the substrate. The second patterning process includes: performing a second laser processing to pattern the initial second oxide layer to form a second oxide layer, and performing a second wet etching process to remove the initial second doped layer exposed uncovered by the second oxide layer. Before forming the first electrode and the second electrode, the method further includes: removing the second oxide layer.

In some embodiments, a film layer on the surface of the first doped layer is removed by the second wet etching process. A process time of the second wet etching process is in a range from 300 s to 800 s, and a process temperature of the second wet etching process is in a range from 60° C. to 80° C.

According to some embodiments of the present disclosure, on the other hand, the embodiments of the present disclosure further provide a photovoltaic module, including: a cell string formed by electrically connecting a plurality of solar cells of any one of the embodiments above or by electrically connecting a plurality of solar cells manufactured by the manufacturing method for solar cell of any one of the embodiments above; a packaging film configured to cover a surface of the cell string; and a cover plate configured to cover a surface of the packaging film away from the cell string.

In some embodiments, the plurality of solar cells electrically connected in series or in parallel.

In some embodiments, the plurality of solar cells are electrically connected through conductive tapes.

BRIEF DESCRIPTION OF THE DRAWINGS

One or more embodiments are exemplarily illustrated by views in the corresponding drawings, and these illustrative descriptions do not constitute a limitation on the embodiments. Unless otherwise specified, the views in the drawings do not constitute a scale limitation. In order to illustrate the technical solutions in the embodiments of the present disclosure or in the traditional art more clearly, the drawings required for use in the embodiments are briefly described hereinafter. Obviously, the drawings described hereinafter are only some embodiments of the present disclosure. For the ordinary skilled in the art, other drawings may be obtained based on these drawings without creative work.

DETAILED DESCRIPTION OF THE EMBODIMENTS

As can be seen from the background technology, the existing solar cell has the problem that a light utilization rate thereof needs to be improved.

An embodiment of the disclosed provides a solar cell, which includes a substrate, and a first doped layer and a second doped layer alternately arranged along a first direction on a back side of the substrate, and a first electrode and a second electrode. The first doped layer and the second doped layer adjacent to the first doped layer are separated by an isolation region. A doping type of the first doped layer is different from that of the second doped layer. A portion of the back side located at the isolation region is exposed. The first doped layer has a first sloped sidewall facing the isolation region, and the second doped layer has a second sloped sidewall facing the isolation region is. The first electrode is in electrical contact with the first doped layer, and the second electrode is in electrical contact with the second doped layer. In this way, the first sloped sidewall and the second sloped sidewall enable more incident light rays to be reflected into the solar cell, thereby improving the light utilization rate of the solar cell and improving the efficiency of the cell.

In order to make the purpose, technical solutions and advantages of the embodiments of the present invention clearer, the embodiments of the present invention will be described in detail below with reference to the accompanying drawings. It may be understood by those skilled in the art that in the embodiments of the present invention, many technical details are provided to allow readers to better understand the present invention, but, even without these technical details, the technical solutions claimed in the present invention may also be implemented based on various changes and modifications of the following embodiments.

Figure 1:
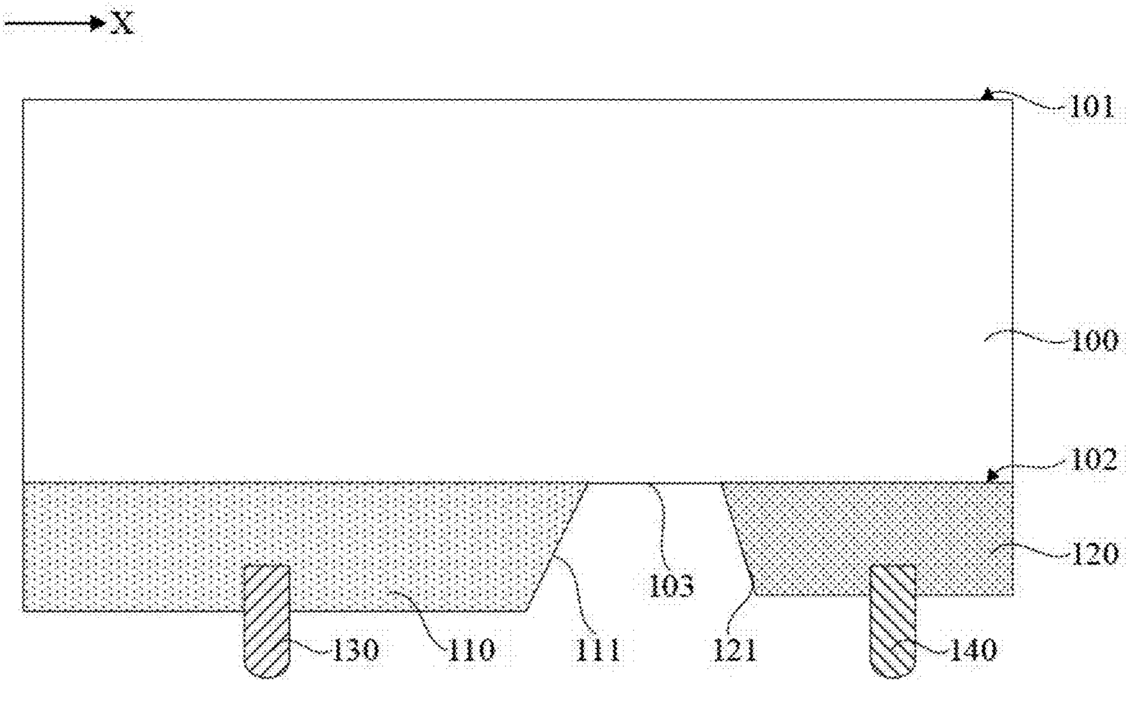
FIG. 1 is a schematic view showing a structure of a solar cell according to an embodiment of the present disclosure.
Figure 2:
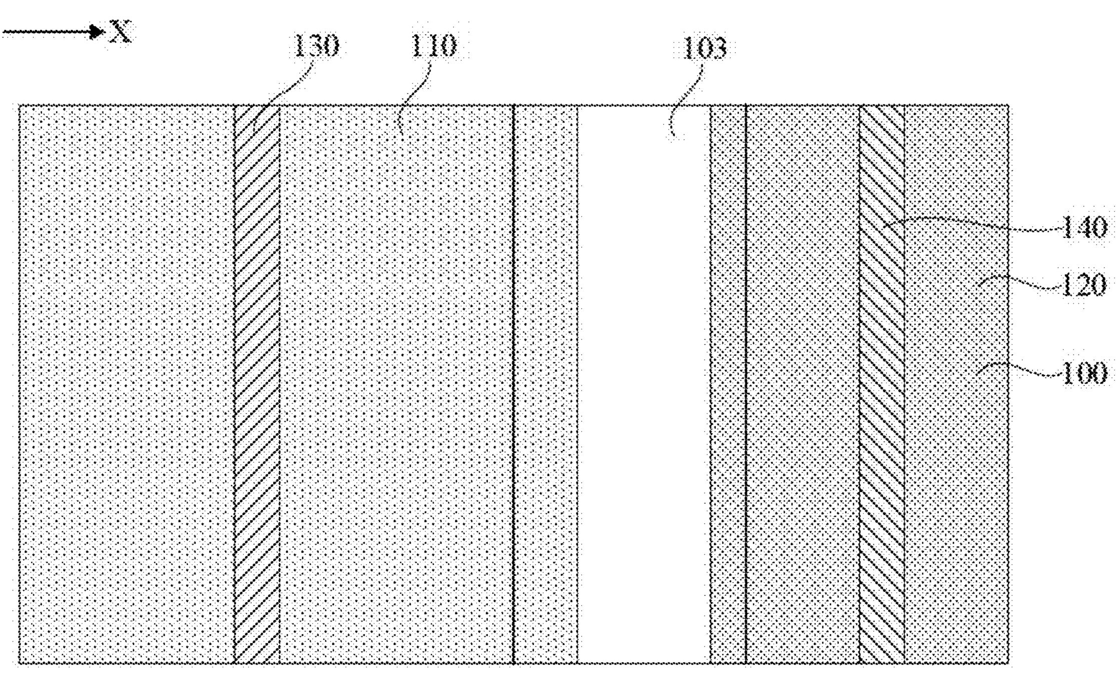
FIG. 2 is a schematic bottom view showing the structure of the solar cell in FIG. 1.

FIG. 1 is a schematic view showing a structure of a solar cell according to an embodiment of the present disclosure. FIG. 2 is a schematic bottom view showing the structure of the solar cell in FIG. 1.

Referring to FIG. 1 and FIG. 2, the solar cell includes a substrate 100 having a front side 101 and a back side 102 opposite to each other, a first doped layer 110 and a second doped layer 120 alternately arranged along a first direction X on the back side 102, and a first electrode 130 and a second electrode 140. The first doped layer 110 and the second doped layer 120 adjacent to the first doped layer 110 are separated by an isolation region 103. The doping type of the first doped layer 110 is different from the doping type of the second doped layer 120. A portion of the back side 102 at the isolation region 103 is exposed. The first doped layer 110 has a first slope sidewall 111 facing the isolation region 103, and the second doped layer 120 has a second slope sidewall 121 facing the isolation region 103. The first electrode 130 is in electrical contact with the first doped layer 110, and the second electrode 140 is in electrical contact with the second doped layer 120.

In the related art, the back side of the substrate of the IBC cell has a first doped layer and a second doped layer that are alternately arranged along a first direction and have different doping types, and the first doped layer and the second doped layer adjacent to the first doped layer are separated by an isolation region. However, the sidewall of the first doped layer facing the isolation region is a conventional vertical sidewall, and the sidewall of the second doped layer facing the isolation region is also a conventional vertical sidewall, which will cause a large number of light rays incident on the solar cell to be reflected outwards. The incident light rays irradiating the conventional vertical sidewall are not reflected into the cell, but reflected outside the cell and cannot be utilized, which will reduce the light utilization rate of the solar cell and affect the efficiency of the cell.

In the embodiment of the present disclosure, the sidewall of the first doped layer 110 facing the isolation region 103 is configured to be the first slope sidewall 111, and the sidewall of the second doped layer 120 facing the isolation region 103 is configured to be the second slope sidewall 121. When the incident light rays irradiate the first slope sidewall 111 or the second slope sidewall 121, they can be reflected into the cell, and can be utilized and converted into electrical energy, that is, the first slope sidewall 111 and the second slope sidewall 121 enable more incident light rays to be reflected into the solar cell, thereby improving the light utilization rate of the solar cell and improving the efficiency of the cell. In addition, the first slope sidewall 111 and the second slope sidewall 121 can lengthen an optical path length in the cell, thereby improving a current density of the solar cell.

It should be noted that the cell may include multiple first doped layers 110, multiple second doped layers 120, and multiple isolation regions 103. The views show only one first doped layer 110, one second doped layer 120, and one isolation region 103.

In some embodiments, the solar cell may be an Interdigitated Back Contact (IBC) cell.

In some embodiments, a material of the substrate 100 may be an elemental semiconductor material. Specifically, the elemental semiconductor material is composed of a single element, such as silicon or germanium. The elemental semiconductor material may be in a single crystalline state, a polycrystalline state, an amorphous state, or a microcrystalline state (i.e. a state having both the single crystalline state and the amorphous state, which is referred to as the microcrystalline state). For example, the silicon may include at least one of single crystalline silicon, polycrystalline silicon, amorphous silicon, or microcrystalline silicon.

In some embodiments, a material of the substrate 100 may also be a compound semiconductor material. Common compound semiconductor materials include but are not limited to silicon germanium, silicon carbide, gallium arsenide, indium gallium, perovskite, cadmium telluride, copper indium selenide and the like. The substrate 100 may also be a sapphire substrate, a silicon substrate on an insulator, or a germanium substrate on an insulator.

In some embodiments, the substrate 100 may be an N-type semiconductor substrate 100 or a P-type semiconductor substrate 100. The N-type semiconductor substrate 100 is doped with an N-type doping element, and the N-type doping element may be any one of the V-group elements such as phosphorus (P), bismuth (Bi), stibium (Sb), or arsenic (As). The P-type semiconductor substrate 100 is doped with a P-type element, and the P-type doping element may be any one of the III-group elements such as boron (B), aluminum (Al), gallium (Ga), or indium (In).

In some embodiments, a doping ion in the first doped layer 110 may include a P-type doping element such as a boron ion, and a doping ion in the second doped layer 120 may include an N-type doping element such as a phosphorus ion. When the substrate 100 is the N-type substrate, the doping type of the first doped layer 110 is different from the doping type of the substrate 100, and the doping type of the second doped layer 120 is the same as the doping type of the substrate 100, and in this case, the first doped layer 110 and the substrate 100 form a p-n junction, and the first doped layer 110 may be used as an emitter of the solar cell. When the substrate 100 is a P-type substrate, the doping type of the first doped layer 110 is the same as the doping type of the substrate 100, and the doping type of the second doped layer 120 is different from the doping type of the substrate 100, and in this case, the second doped layer 120 and the substrate 100 form a p-n junction, and the second doped layer 120 may be used as the emitter of the solar cell. The first doped layer 110 and the second doped layer 120 having different doping types are both located on the back side 102 of the substrate 100, thereby reducing an occupied area of the front side 101 of the substrate 100 by the electrode. There are no gridlines shading the front side of the cell, which may eliminate the shading of the metal electrodes, reduce current loss, and maximize the utilization rate of incident photons. Moreover, there is no need to consider the problem of gridline shading, therefore the gridline ratio may be appropriately increased, thereby reducing series resistance while achieving a high fill factor.

Figure 3:
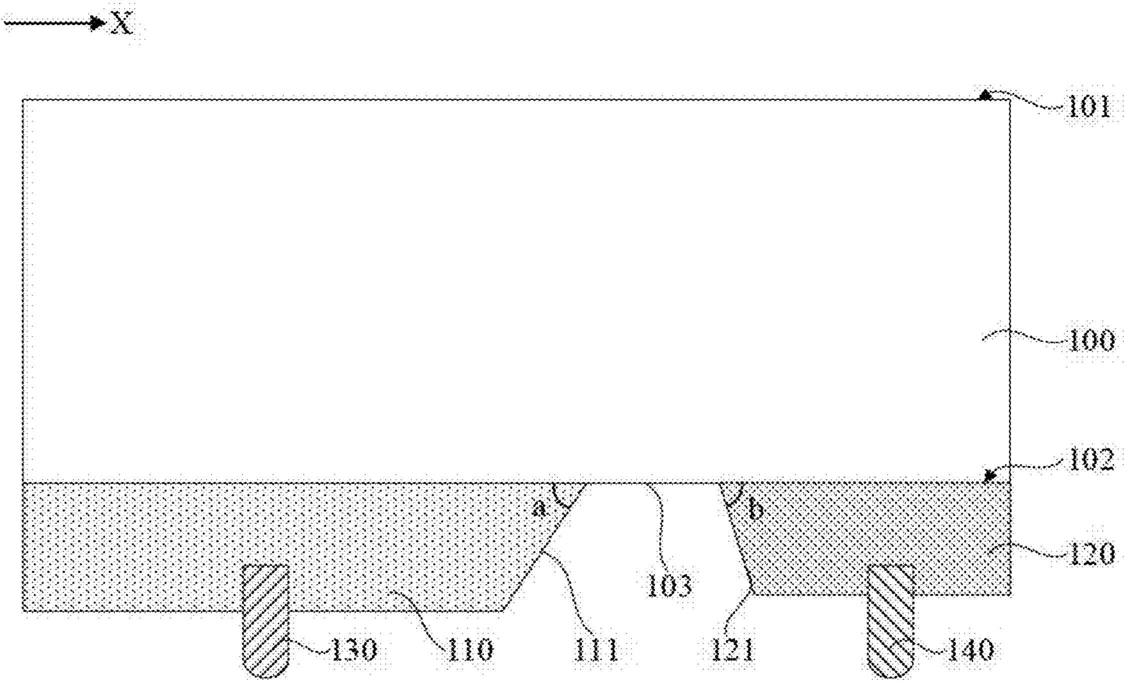
FIG. 3 is a schematic view showing a structure of the solar cell according to another embodiment of the present disclosure.

Referring to FIG. 3, in some embodiments, an angle between the first sloped sidewall 111 and a surface of the first doped layer 110 facing the back side 102 is termed a first angle a, which may be an acute angle. An angle between the second sloped sidewall 121 and a surface of the second doped layer 120 facing the back side 102 is termed a second angle b, which may be an acute angle. When the first angle a and the second angle b are acute angles, the first sloped sidewall 111 protrudes in a direction from the first doped layer 110 toward the isolation region 103, and the second sloped sidewall 121 protrudes in a direction from the second doped layer 120 toward the isolation region 103. In this way, the first sloped sidewall 111 and the second sloped sidewall 121 enable more incident light rays to be reflected into the solar cell, thereby improving the light utilization rate of the solar cell and improving the efficiency of the cell.

In some embodiments, the first angle a may be less than or equal to the second angle b. When the first angle a is less than the second angle b, the first sloped sidewall 111 and the second sloped sidewall 121 may have different slopes, and the slope of the first sloped sidewall 111 is less than the slope of the second sloped sidewall 121. In this way, the first sloped sidewall 111 and the second sloped sidewall 121 may reflect different incident light rays, so that light rays incident at different angles may be reflected into the cell for reuse, thereby further improving the light utilization rate of the solar cell.

It should be noted that, during a manufacture of the solar cell, an etching time of the first sloped sidewall 111 of the first doped layer 110 is longer than an etching time of the second sloped sidewall 121 of the second doped layer 120. Therefore, the slope of the first sloped sidewall 111 may be less than or equal to the slope of the second sloped sidewall 121, that is, the first angle a may be less than or equal to the second angle b.

In some embodiments, the first angle a may be in a range from 25° to 60°, and the second angle b may be in a range from 30° to 65°. For example, the first angle a may be 25°, 30°, 45°, or 60°, etc., and the second angle b may be 30°, 45°, 60°, or 65°, etc. If the first angle a is too large or too small, the first slope sidewall 111 has a relatively low inclination, or the first slope sidewall 111 tends to be a vertical sidewall, thus the first slope sidewall 111 has a poor reflection effect on the incident light ray, which makes it difficult to effectively improve the light utilization rate of the cell. If the second angle b is too large or too small, the second slope sidewall 121 has a relatively low inclination, or the second slope sidewall 121 tends to be a vertical sidewall, thus the second slope sidewall 121 has a poor reflection effect on the incident light ray, which makes it difficult to effectively improve the light utilization rate of the cell. Therefore, the first angle a and the second angle b need to be selected from a suitable range. When the first angle a is in a range from 25° to 60°, and when the second angle b is in a range from 30° to 65°, the light utilization rate of the cell can be effectively improved, and the efficiency of the cell can be improved.

Figure 4:
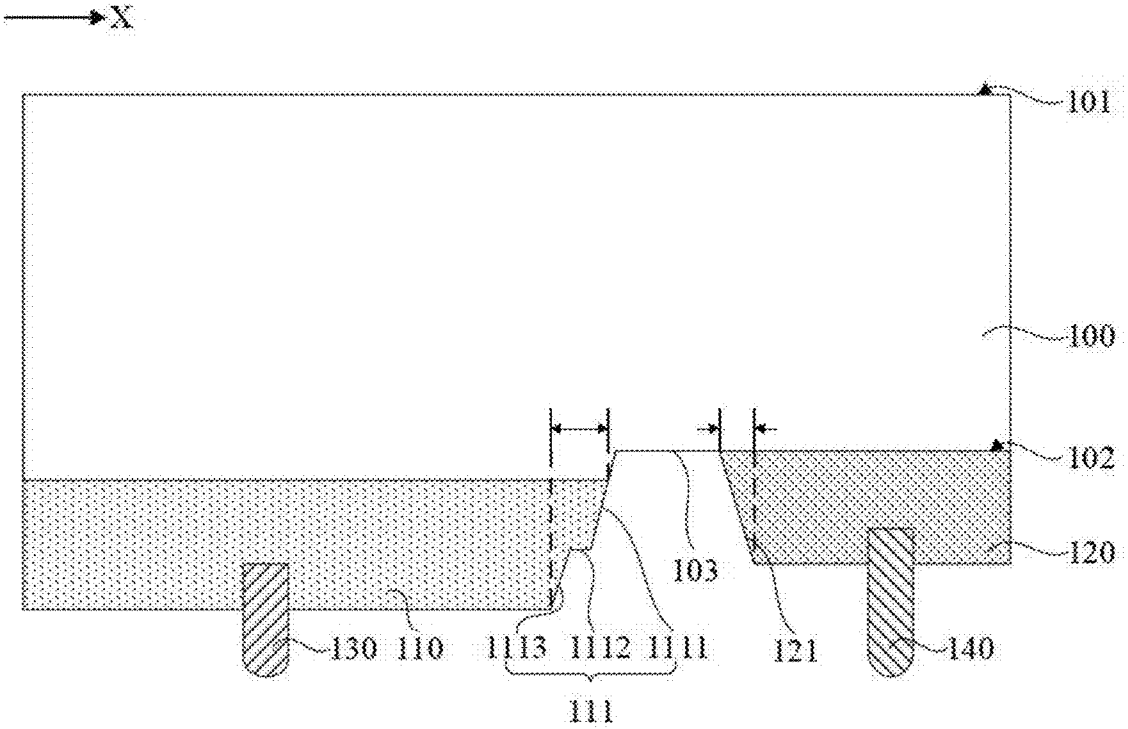
FIG. 4 is a schematic view showing a structure of the solar cell according to another embodiment of the present disclosure.

Referring to FIG. 4, in some embodiments, in a direction away from the back side 102 of the substrate 100, the first slope sidewall 111 may include a first sub-slope sidewall 1111, a platform surface 1112, and a second sub-slope sidewall 1113 connected in sequence. It should be noted that the platform surface 1112 may be parallel to the back side of the substrate 100. Alternatively, the platform surface 1112 may also have a certain slope. In this way, the first sub-slope sidewall 1111, the second sub-slope sidewall 1113, and the platform surface 1112 located in different planes each enable more incident light rays to be reflected into the solar cell, and further improve the light utilization rate of the solar cell, thus further improving the efficiency of the cell. In addition, the first sub-slope sidewall 1111, the platform surface 1112, and the second sub-slope sidewall 1113 may also further scatter the light rays transmitted into the cell, so that the optical path length in the cell is further lengthened, and the current density of the solar cell is further improved.

In some embodiments, in a direction perpendicular to the back side 102 of the substrate 100, a distance between a surface of the first doped layer 110 away from the substrate 100 and the front side 101 of the substrate 100 may be greater than a distance between a surface of the second doped layer 120 away from the substrate 100 and the front side 101 of the substrate 100. The platform surface 1112 is closer to the back side 102 than the surface of the second doped layer 120 away from the substrate 100 is. During a manufacture of the solar cell, if the distance between the surface of the first doped layer 110 away from the substrate 100 and the front side 101 of the substrate 100 is greater than the distance between the surface of the second doped layer 120 away from the substrate 100 and the front side 101 of the substrate 100, the un-patterned second doped layer 120 can cover a portion of the first slope sidewall 111 having a certain thickness. When the isolation region 103 is patterned to expose the back side 102 of the substrate 100, the etching time of one portion of the first slope sidewall 111 uncovered by the second doped layer 120 will be greater than the etching time of another portion of the first slope sidewall 111 covered by the second doped layer 120. Thus, after the patterning is completed, the first slope sidewall 111 including the first sub-slope sidewall 1111, the platform surface 1112, and the second sub-slope sidewall 1113 can be formed, so that each of the first sub-slope sidewall 1111, the second sub-slope sidewall 1113, and the platform surface 1112, which are located in different planes, enable more incident light rays to be reflected into the solar cell, and further improve the light utilization rate of the solar cell, thereby further improving the efficiency of the cell.

It should be noted that, during the manufacture of the solar cell, when the second doped layer 120 at the isolation region 103 is patterned to expose the back side 102 of the substrate 100, the platform surface 1112 which is originally coplanar with a surface of the second doped layer 120 away from the substrate 100 is also etched. Therefore, the platform surface 1112 is closer to the back side 102 than the surface of the second doped layer 120 away from the substrate 100 is.

In some other embodiments, the distance between the platform surface 1112 and the back side 102 of the substrate 100 and the distance between the surface of the second doped layer 120 away from the substrate 100 and the back side 102 may be the same.

Continuing to refer to FIG. 4, in some embodiments, in the direction perpendicular to the back side 102 of the substrate 100, a thickness of the second sub-slope sidewall 1113 may be less than a thickness of the first sub-slope sidewall 1111. When forming the first sub-slope sidewall 1111 and the second sub-slope sidewall 1113, an etching direction of the etching process is a direction approaching the substrate 100, and the etching time of the first sub-slope sidewall 1111 close to the substrate 100 is less than the etching time of the second sub-slope sidewall 1113 away from the substrate 100, therefore the thickness of the first sub-slope sidewall 1111 etched away is less than the thickness of the second sub-slope sidewall 1113 etched away, and the thickness of the second sub-slope sidewall 1113 finally formed may be less than the thickness of the first sub-slope sidewall 1111 finally formed. The thickness of the first sub-slope sidewall 1111 and the thickness of the second sub-slope sidewall 1113 are a dimension of the first sub-slope sidewall 1111 and a dimension of the second sub-slope sidewall 1113 respectively in the direction perpendicular to the back side 102. In this way, the first sub-slope sidewall 1111 and the second sub-slope sidewall 1113 are not on the same plane, and the first sub-slope sidewall 1111 and the second sub-slope sidewall 1113 can reflect light rays incident at different angles to improve the utilization rate of the incident light rays, thereby further improving the light utilization rate of the cell and improving the efficiency of the cell.

In some other embodiments, in the direction perpendicular to the back side 102 of the substrate 100, the thickness of the second sub-slope sidewall 1113 may be greater than or equal to the thickness of the first sub-slope sidewall 1111.

Figure 5:
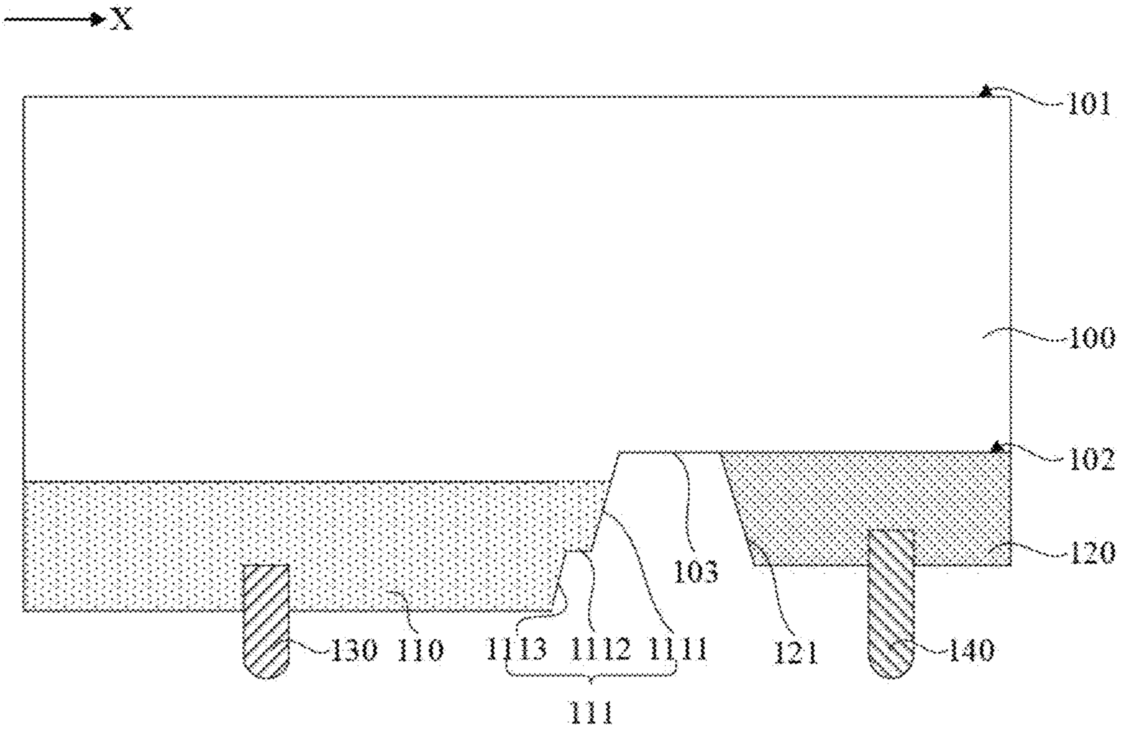
FIG. 5 is a schematic view showing a structure of the solar cell according to another embodiment of the present disclosure.

Referring to FIG. 5, in some embodiments, the slope of the second sub-slope sidewall 1113 relative to the back side 102 may be greater than the slope of the first sub-slope sidewall 1111 relative to the back side 102. That is, the second sub-slope sidewall 1113 is closer to be a vertical wall than the first sub-slope sidewall 1111 is. When forming the first sub-slope sidewall 1111 and the second sub-slope sidewall 1113, an etching direction of the etching process is a direction approaching the substrate 100, and the etching time of the first sub-slope sidewall 1111 close to the substrate 100 is less than the etching time of the second sub-slope sidewall 1113 away from the substrate 100, therefore the slope of the second sub-slope sidewall 1113 relative to the back side 102 may be greater than the slope of the first sub-slope sidewall 1111 relative to the back side 102. In such an arrangement, the first sub-slope sidewall 1111 and the second sub-slope sidewall 1113 have different slopes, so that the first sub-slope sidewall 1111 and the second sub-slope sidewall 1113 can reflect the light rays incident at different angles to improve the utilization rate of the incident light rays, thereby further improving the light utilization rate of the cell and improving the efficiency of the cell.

In some other embodiments, the slopes of the second sub-sloped sidewall 1113 and first sub-sloped sidewall 1111 relative to the back side 102 may also be the same.

Figure 6:
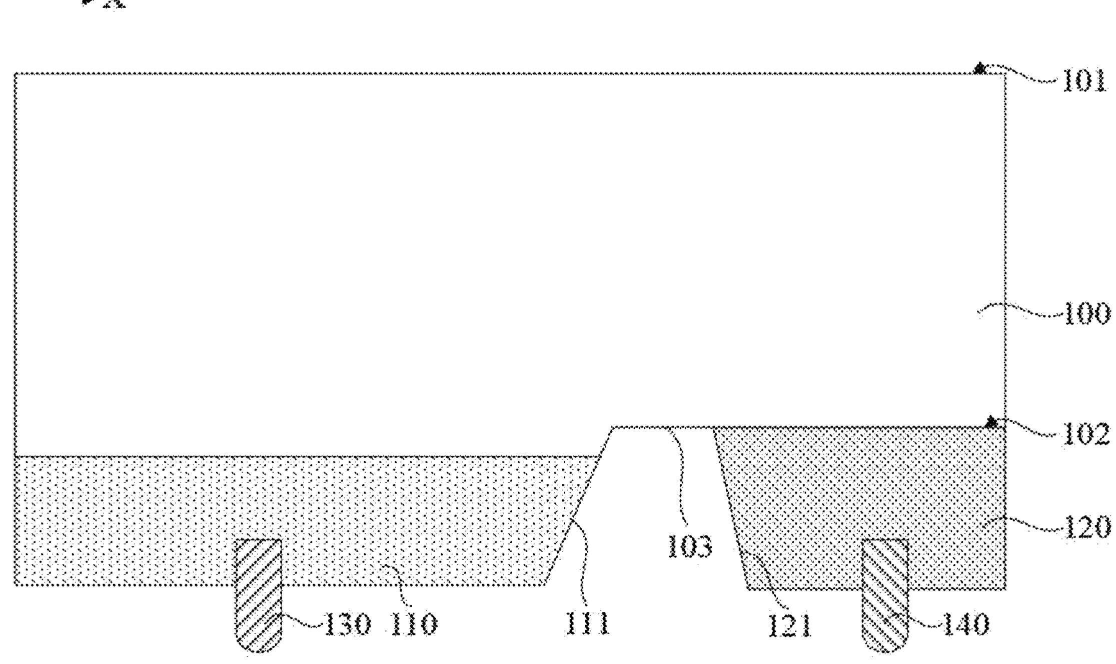
FIG. 6 is a schematic view showing a structure of the solar cell according to another embodiment of the present disclosure.

Referring to FIG. 6, in some embodiments, in the direction perpendicular to the back side 102 of the substrate 100, the distance between the surface of the first doped layer 110 away from the substrate 100 and the front side 101 of the substrate 100 may also be less than or equal to the distance between the surface of the second doped layer 120 away from the substrate 100 and the front side 101 of the substrate 100. That is, the surface of the second doped layer 120 away from the substrate 100, compared with the surface of the first doped layer 110 away from the substrate 100, protrudes in a direction away from the substrate 100. Alternatively, the surface of the second doped layer 120 away from the substrate 100 is aligned with the surface of the first doped layer 110 away from the substrate 100.

The distance between the surface of the first doped layer 110 away from the substrate 100 and the front side 101 of the substrate 100 being less than or equal to the distance between the surface of the second doped layer 120 away from the substrate 100 and the front side 101 of the substrate 100 does not mean that the thickness of the first doped layer 110 being less than or equal to the thickness of the second doped layer 120. Since there may be a certain amount of over-etching when forming the first doped layer 110 and the second doped layer 120, the back side 102 of one portion of the substrate 100 corresponding to the first doped layer 110 and the back side 102 of another portion of the substrate 100 corresponding to the second doped layer 120 are not necessarily on the same plane. Therefore, the relationship between the surface of the first doped layer 110 away from one side of the substrate 100 and the surface of the second doped layer 120 away from the same side of the substrate 100 cannot be described by the relationship between the thicknesses of the first doped layer 110 and the second doped layer 120. In addition, referring to FIG. 4 to FIG. 6, when forming the first doped layer 110 and the second doped layer 120 and over-etching the substrate 100, a portion of the substrate 100 adjoined to the sloped sidewall of the first doped layer 110 may also have a sloped sidewall.

Continuing to refer to FIG. 6, in some embodiments, the first sloped sidewall 111 may be a continuous slope. When forming the first doped layer 110 and the second doped layer 120, the distance between the surface of the second doped layer 120 away from the substrate 100 and the front side 101 of the substrate 100 is greater than or equal to the distance between the surface of the first doped layer 110 away from the substrate 100 and the front side 101 of the substrate 100, and the un-patterned second doped layer 120 can cover the whole first slope sidewall 111, therefore, the first sloped sidewall 111 is subjected to the etching process only once in the process of patterning the second doped layer 120, and the first sloped sidewall 111 will not be converted into a discontinuous slope, and thus the first sloped sidewall 111 finally formed may still be a continuous slope. Since a second passivation layer 180 covering the first doped layer 110 and the second doped layer 120 may be formed after the first doped layer 110 and the second doped layer 120 are formed, the first slope sidewall 111 being the continuous slope is also conducive to forming the second passivation layer 80, facilitates the deposition of the second passivation layer 180, and reduces the deposition difficulty of the second passivation layer 180, thereby reducing the production difficulty and improving the production efficiency.

In some embodiments, the second sloped sidewall 121 may be one continuous slope. The second sloped sidewall 121 is a sloped sidewall remained after the second doped layer 120 is patterned. The second sloped sidewall 121 is subjected to a continuous etching process only once, so the second sloped sidewall 121 may be the continuous slope.

Figure 7:
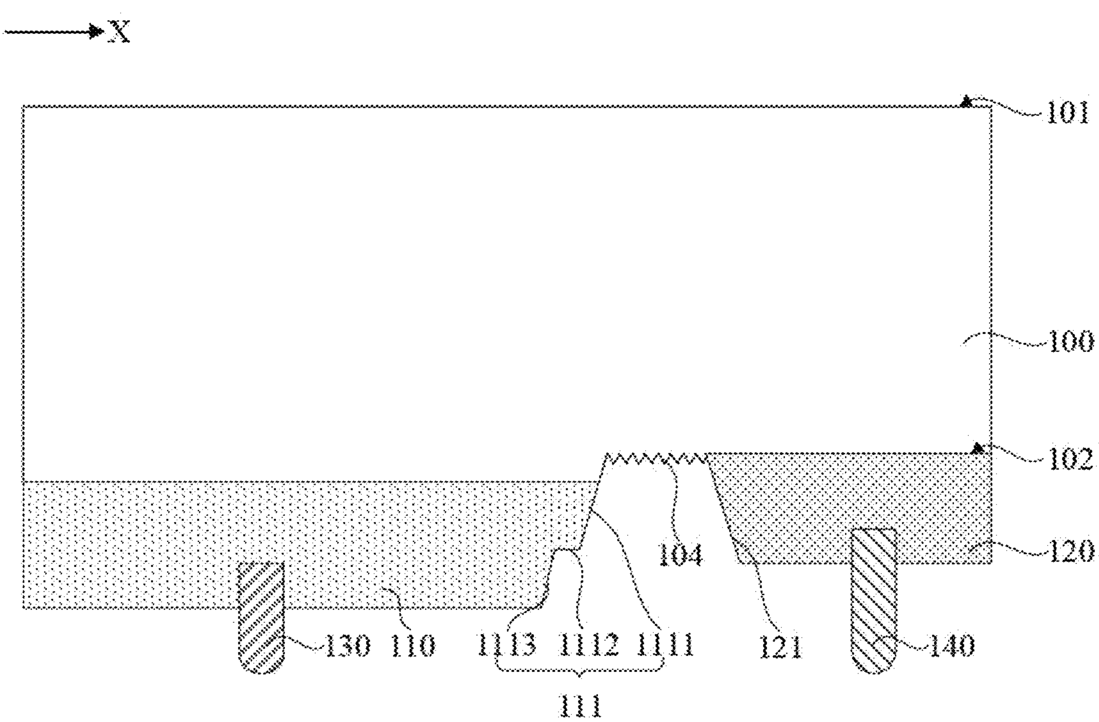
FIG. 7 is a schematic view showing a structure of the solar cell according to another embodiment of the present disclosure.

Referring to FIG. 7, in some embodiments, the portion of the back side 102 exposed at the isolation region 103 may have a textured structure 104, and the textured structure 104 may include a plurality of pyramid-shaped structures. While patterning the second doped layer 120 to expose the back side 102 of the substrate 100 at the isolation region 103, the etching environment can also perform a texturization treatment on the back side 102 uncovered by the isolation region 103, so that the back side 102 exposed at the isolation region 103 has the textured structure. In this way, the textured structure can reflect the incident light rays so that some of the incident light rays can be reflected into the cell for reuse, which can further improve the light utilization rate of the cell and improve the efficiency of the cell. In addition, the back side 102 exposed at the isolation region 103 has the textured structure, which enables the light rays transmitted into the cell to be further scattered, so that the optical path length in the cell is further lengthened, and the current density of the solar cell can be further improved.

In some embodiments, a width of a bottom surface of each pyramid-shaped structure in a direction parallel to the back side 102 may be in a range from 2 μm to 4 μm. For example, the width of the bottom surface of the pyramid-shaped structure in the direction parallel to the back side 102 may be 2 μm, 3 μm, or 4 μm, etc. It should be noted that the width of the bottom surface of the pyramid-shaped structure is the maximum width of the bottom surface of the pyramid-shaped structure in any direction parallel to the back side 102. In the direction parallel to the back side 102, if the width of the bottom surface of the pyramid-shaped structure is too large, the number of the pyramid-shaped structures in the isolation region 103 will be too small, the textured structure will have a poor effect on improving the reflection of the incident light rays, and the light utilization rate of the cell is relatively low, and the efficiency of the cell still needs to be improved. If the width of the bottom surface of the pyramid-shaped structure is too small, a height of the pyramid-shaped structure will be relatively small correspondingly, thus the textured structure will have a poor effect on improving the reflection of incident light rays, and the light utilization rate of the cell is relatively low, and the efficiency of the cell still needs to be improved. Therefore, in the direction parallel to the back side 102, a suitable range needs to be selected for the width of the bottom surface of the pyramid-shaped structure. When the width of the bottom surface of the pyramid-shaped structure is in a range from 2 μm to 4 μm, the textured structure has a better effect on improving the reflection of the incident light rays, and the light utilization rate of the cell can be effectively improved, and the efficiency of the cell can be effectively improved.

It should be noted that, in the textured structure shown in FIG. 7, the sizes of the pyramid-shaped structures are the same, but in an actual textured structure, the sizes of the pyramid-shaped structures may be different, and specifically, the widths of the pyramid-shaped structures in the direction parallel to the back side 102 may be different, and the heights of the pyramid-shaped structures may be different.

Figure 8:
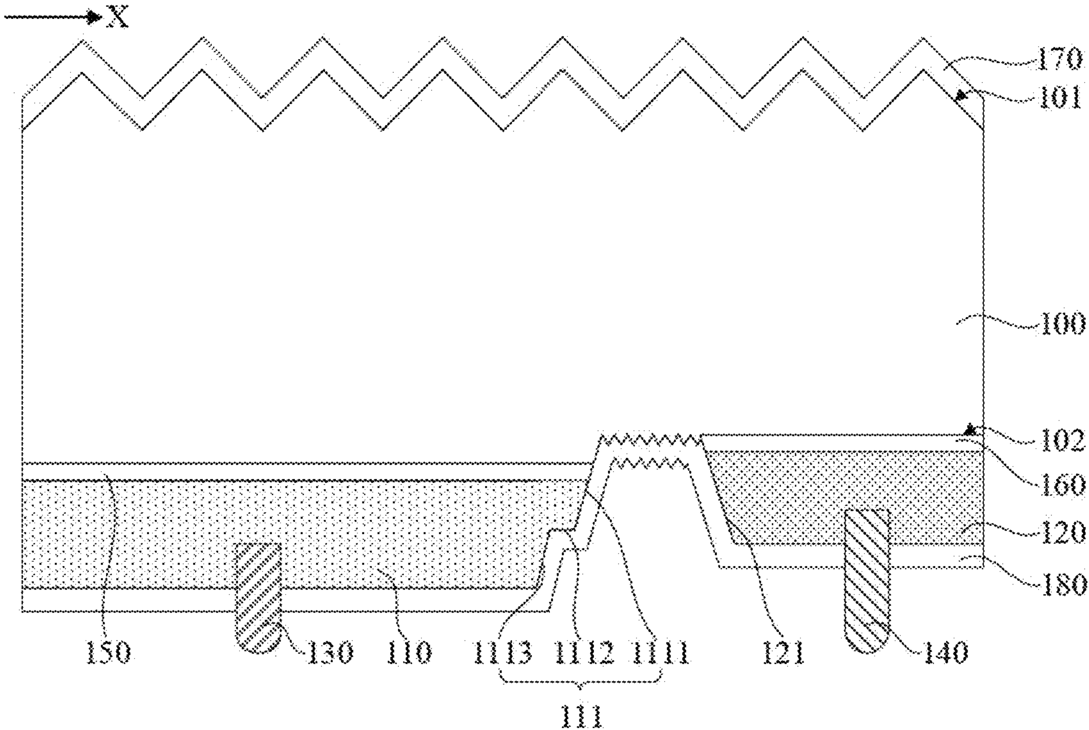
FIG. 8 is a schematic view showing a structure of the solar cell according to another embodiment of the present disclosure.

Referring to FIG. 8, in some embodiments, a texturing treatment may be performed on the substrate 100, so that the textured structure is formed on the front side of the substrate 100, thereby enhancing the light absorption utilization rate of the substrate 100. In some embodiments, the textured structure may be a pyramid textured structure, which, as a common textured structure, not only reduces the reflectivity of the surface of the substrate 100, but also forms a light trap, thereby enhancing the light absorption effect of the substrate 100 and increasing the photoelectric conversion efficiency of the solar cell.

In some embodiments, the solar cell may further include a first tunneling layer 150 and a second tunneling layer 160, and the first tunneling layer 150 is located between the first doped layer 110 and the substrate 100, and the second tunneling layer 160 is located between the second doped layer 120 and the substrate 100. The first tunneling layer 150 and the second tunneling layer 160 allow majority carriers to tunnel into the doped layer while stopping minority carriers from passing through, and then majority carriers are transported laterally in the doped layer and collected by an electrode, reducing the recombination of carriers and increasing the open circuit voltage and a short circuit current of the cell. At this time, the tunnel oxide layer and the doped layer constitute a tunnel oxide passivation contact structure, which can achieve excellent interface passivation and a selective collection of carriers, and improve the photoelectric conversion efficiency of the BC cell.

It should be noted that, when forming the first doped layer 110 and the second doped layer 120 and over-etching the substrate 100, a sidewall of the first tunneling layer 150 adjoined to the sloped sidewall of the first doped layer 110 may be sloped, and a sidewall of a portion of the substrate 100 adjoined to the sloped sidewall of the first tunneling layer 150 may also be sloped, and a sidewall of the second tunneling layer 160 adjoined to the second doped layer 120 may be sloped.

In some embodiments, a material of the first tunneling layer 150 may include at least one of silicon oxide, silicon nitride, silicon oxynitride, silicon carbide, or magnesium fluoride. A material of the second tunneling layer 160 may include at least one of silicon oxide, silicon nitride, silicon oxynitride, silicon carbide, or magnesium fluoride.

In some embodiments, the solar cell may further include a first passivation layer 170 located on the front side 101 of the substrate 100 and a second passivation layer 180 located on the back side 102 of the substrate 100. The first passivation layer 170 may cover a surface of the front side 101 of the substrate 100, and the second passivation layer 180 may cover a surface of the back side 102 of the substrate 100 and cover the surfaces of the first doped layer 110 and the second doped layer 120 located on the back side 102 of the substrate 100. The electrodes in the solar cell penetrate the second passivation layer 180 and become in electrical contact with the first doped layer 110 or the second doped layer 120.

The first passivation layer 170 has a good passivation effect on the front side 101 of the substrate 100, reduces a defect-state density on the front side 101 of the substrate 100, and effectively suppresses the recombination of carriers on the front side 101 of the substrate 100. The first passivation layer 170 can also have a good anti-reflection effect, reduce the reflection of the light rays incident on the front side 101 of the substrate 100, and improve the utilization rate of the incident light rays of the substrate 100. The second passivation layer 180 can have a good passivation effect on the back side 102 of the substrate 100, for example, it can perform good chemical passivation on the dangling bonds on the back side 102 of the substrate 100, saturate the dangling bonds on the back side 102 of the substrate 100, reduce the defect-state density on the back side 102 of the substrate 100, and suppress the recombination of carriers on the back side of the substrate 100.

In some embodiments, the material of the first passivation layer 170 may include one of silicon nitride, aluminum oxide, silicon nitride, or silicon oxynitride. The material of the second passivation layer 180 may include at least one of silicon oxide, aluminum oxide, silicon nitride, or silicon oxynitride.

In some embodiments, the first passivation layer 170 may be a single-layer structure or a multi-layer structure. For a multi-layer structure, the materials of different layers may be different from each other, or the materials of some layers may be the same and different from the materials of other layers. For example, the first passivation layer 170 may be a multi-layer structure including a silicon nitride layer and an aluminum oxide layer. In some embodiments, the second passivation layer 180 may be a single-layer structure. In some embodiments, the second passivation layer 180 may also be a multi-layer structure, in which the materials of all layers may be different from each other, or in which the materials of some layers may be different, and the materials of other lays may be the same. For example, the second passivation layer 180 may be the multi-layer structure including a silicon nitride layer and an aluminum oxide layer.

If the second passivation layer 180 includes the aluminum oxide layer, when forming the first electrode 130 and the second electrode 140, a laser grooving process may be performed first and then a screen-printing process may be performed, thus ensuring that the first electrode 130 is in electrical contact with the first doped layer 110, and that the second electrode 140 is in electrical contact with the second doped layer 120.

In some embodiments, the first electrode 130 and the second electrode 140 may be formed by sintering a firing-through paste. The method of forming the first electrode 130 and the second electrode 140 may include: printing a metal paste by using a screen-printing process. The metal paste may include at least one of silver, aluminum, copper, tin, gold, lead or nickel.

In some embodiments, the width of the first doped layer 110 along the first direction X may be greater than the width of the second doped layer 120 along the first direction X. Accordingly, a width of the first electrode 130 in electrical contact with the first doped layer 110 along the first direction X may also be greater than a width of the second electrode 140 in electrical contact with the second doped layer 120 along the first direction X. In this way, the first electrode 130 having a relatively large width along the first direction X can better collect carriers, so that a current transmission effect of the solar cell is better.

In some embodiments, the metal paste contains materials with highly corrosive components. In this way, during the sintering process, the corrosive components will corrode some film layers of the cell, thereby causing the metal paste to penetrate into some regions of the cell. The solar cell provided by the embodiment of the present disclosure includes the substrate, and the first doped layer and the second doped layer located on the back side of the substrate and arranged alternately along the first direction. The first doped layer and the second doped layer adjacent to the first doped layer are separated by the isolation region. The doping type of the first doped layer is different from that of the second doped layer. The portion of the back side located at the isolation region is exposed. The sidewall of the first doped layer facing the isolation region is the first sloped sidewall, and the sidewall of the second doped layer facing the isolation region is the second sloped sidewall. The first electrode is in electrical contact with the first doped layer, and the second doped layer is in electrical contact with the second electrode. In this way, the first sloped sidewall and the second sloped sidewall enable more incident light rays to be reflected into the solar cell, thereby increasing the light utilization rate of the solar cell and improving the efficiency of the cell.

Accordingly, another embodiment of the present disclosure further provides a method for manufacturing a solar cell, which may be used to manufacture the solar cell described in the above embodiments. The method for manufacturing the solar cell provided by the embodiment of the present disclosure will be described in detail below in conjunction with the accompanying drawings. For the parts that are the same or correspond to the previous embodiment, refer to the corresponding description of the embodiments above, which will not be described repeatedly in detail hereinafter.

Figure 9:
FIGS. 9 to 15 are schematic views showing structures corresponding to steps of a method for manufacturing a solar cell according to embodiments of the present disclosure, respectively.

Referring to FIG. 9, a substrate 100 is provided. The substrate 100 has a front side 101 and a back side 102 opposite to each other.

In some embodiments, a material of the substrate 100 may be an elemental semiconductor material. Specifically, the elemental semiconductor material is composed of a single element, such as silicon or germanium. The elemental semiconductor material may be in a single crystalline state, a polycrystalline state, an amorphous state, or a microcrystalline state (a state having both the single crystalline state and the amorphous state, which is also referred to as the microcrystalline state). For example, the silicon may be at least one of single crystalline silicon, polycrystalline silicon, amorphous silicon, or microcrystalline silicon.

In some embodiments, a material of the substrate 100 may also be a compound semiconductor material. Common compound semiconductor materials include but are not limited to silicon germanium, silicon carbide, gallium arsenide, indium gallium, perovskite, cadmium telluride, copper indium selenide and the like. The substrate 100 may also be a sapphire substrate, a silicon substrate on an insulator, or a germanium substrate on an insulator.

In some embodiments, the substrate 100 may be an N-type semiconductor substrate 100 or a P-type semiconductor substrate 100. The N-type semiconductor substrate 100 is doped with an N-type doping element, and the N-type doping element may be any one of the V-group elements such as phosphorus (P), bismuth (Bi), stibium (Sb), or arsenic (As). The P-type semiconductor substrate 100 is doped with a P-type element, and the P-type doping element may be any one of the III-group elements such as boron (B), aluminum (Al), gallium (Ga), or indium (In).

Figure 10:
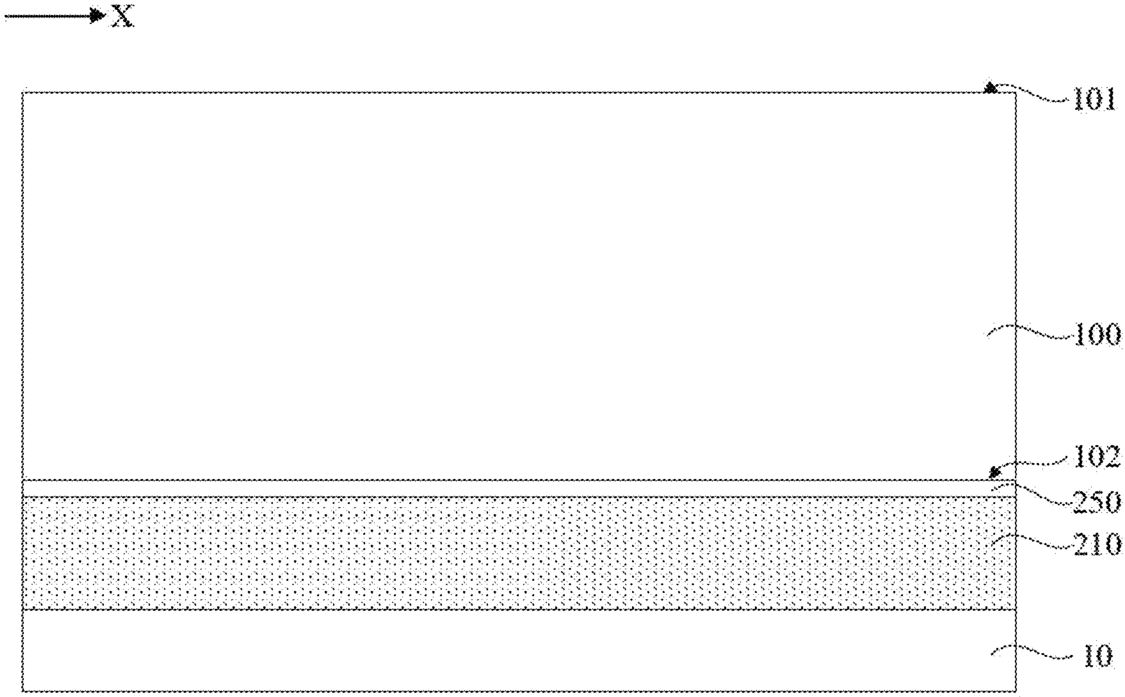

Referring to FIG. 10, an initial first doped layer 210 is formed on the back side 102 of the substrate 100.

Specifically, the substrate 100 may be placed in a diffusion furnace, and the initial first doped layer 210 is formed by diffusion doping. A process temperature of the diffusion doping may be in a range from 800° C. to 1200° C., and a process time of the diffusion doping may be in a range from 2 hours to 5 hours. For example, the process temperature of the diffusion doping may be 800° C., 1000° C., 1100° C., or 1200° C., etc., and the process time of the diffusion doping may be 2 hours, 3 hours, 4 hours, or 5 hours, etc.

In some embodiments, the initial first doped layer 210 may be doped with boron ions.

In some embodiments, before forming the initial first doped layer 210, an initial first tunneling layer 250 may be further formed on the back side 102 of the substrate 100. The initial first tunneling layer 250 covers the back side 102 of the substrate 100, and the initial first doped layer 210 covers a surface of the initial first tunneling layer 250 away from the substrate 100.

In some embodiments, when forming the initial first doped layer 210, an initial first oxide layer 10 may also be formed on a surface of the initial first doped layer 210. The initial first oxide layer 10 may be borosilicate glass (BSG). A thickness of the initial first oxide layer 10 may be in a range from 100 nm to 200 nm. For example, the thickness of the initial first oxide layer 10 may be 100 nm, 150 nm, or 200 nm, etc.

Figure 11:
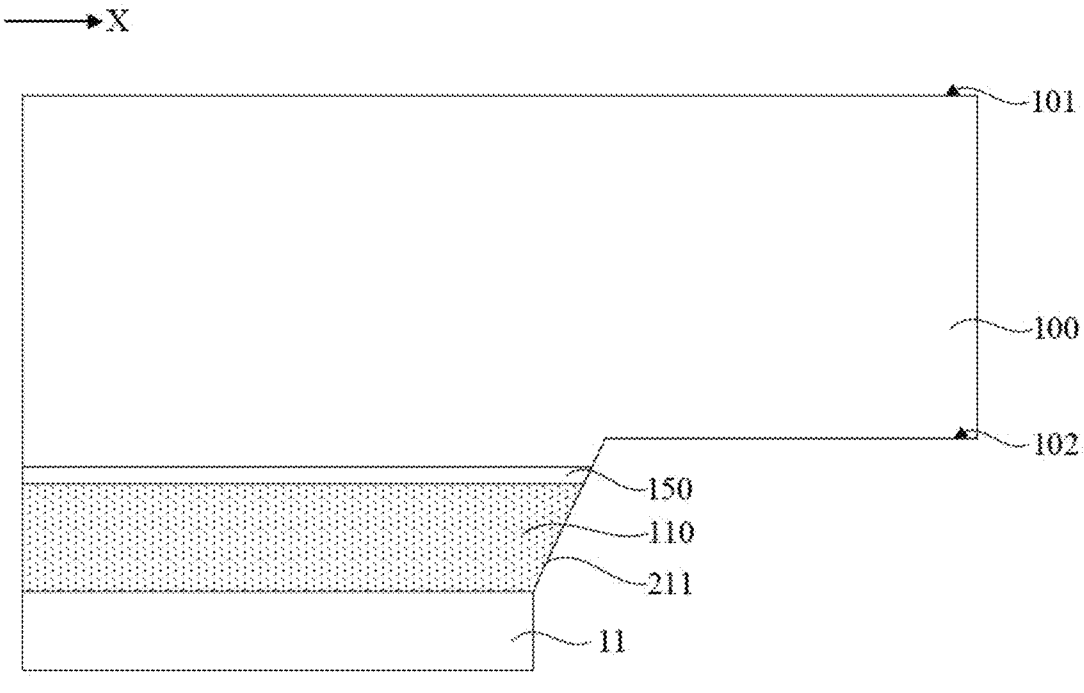
Figure 14:
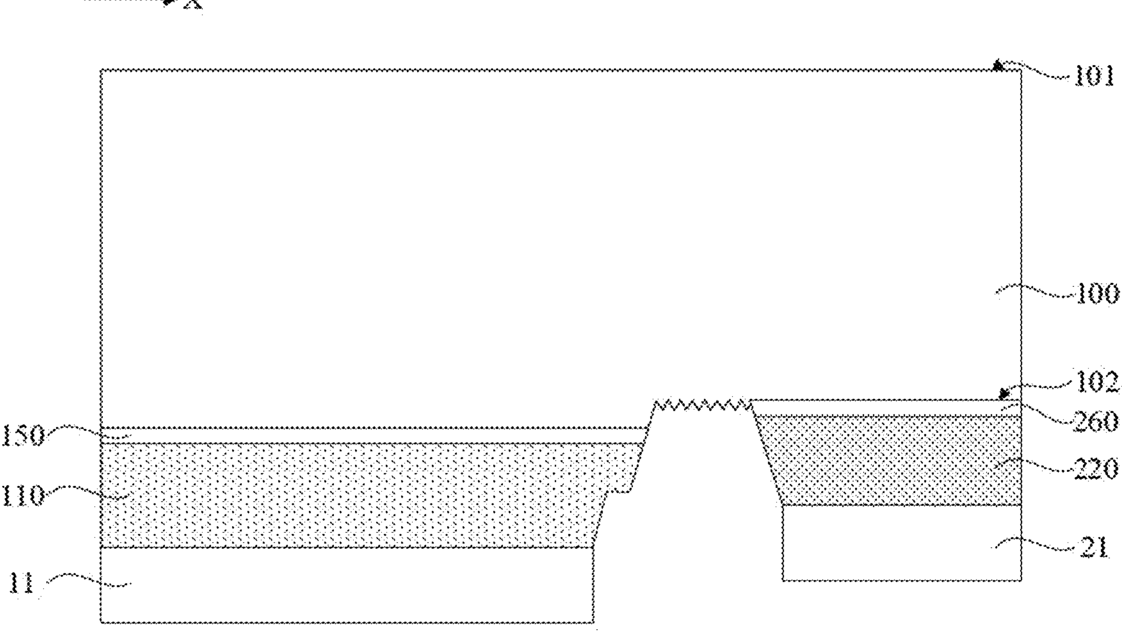

Referring to FIG. 11 and FIG. 14, a first patterning process is performed on the initial first doped layer 210 to form a plurality of first doped layers 110 arranged at intervals along the first direction X, and a sidewall of each first doped layer 110 is an initial first slope sidewall 211.

A width (in the first direction X) of the first doped layer 110 formed by the first patterning process may be in a range of from 400 nm to 800 nm. For example, the width (in the first direction X) of the first doped layer 110 may be 400 nm, 500 nm, 600 nm, 700 nm, or 800 nm, etc.

In some embodiments, a portion of the substrate 100 may be further removed by the first patterning process, so that a thickness of one portion of the substrate 100 covered by the first doped layer 110 is slightly greater than a thickness of another portion of the substrate 100 uncovered by the first doped layer 110.

In some embodiments, steps of the first patterning process may include patterning the initial first oxide layer 10 by using a first laser processing to form a first oxide layer 11, and the first oxide layer 11 is located on the surface of the first doped layer 110 away from the substrate 100. No slope will be formed on the sidewall of the first oxide layer 11 by the first laser processing, and the sidewall of the first oxide layer 11 is a vertical sidewall.

Since patterning the initial first doped layer 210 by using the process of the first laser processing will cause the property of the first doped layer 110 to be modified, a normal performance of the cell will be affected. Thus, the process of the first laser processing can only be used for patterning the initial first oxide layer 10, but cannot be used for patterning the initial first doped layer 210.

In some embodiments, the laser power of the first laser processing may be in a range from 20 W to 30 W. For example, the power of the first laser processing may be 20 W, 25 W, or 30 W, etc. If the laser power of the first laser processing is too high, a waste of energy may be caused, thus increasing the production costs, and the property of the first doped layer 110 is also modified, thus affecting the performance of the cell. If the laser power of the first laser processing is too low, the efficiency of patterning the initial first oxide layer 10 will be too low. Therefore, a suitable range needs to be selected for the laser power of the first laser processing. When the laser power of the first laser processing is in the range from 20 W to 30 W, not only the production costs will not increase, but also the property of the first doped layer can be prevented from being modified, and the production efficiency can be increased.

In some embodiments, a width (in the first direction X) of a first laser processed region may be in a range from 300 μm to 600 μm. For example, the width of the first laser processed region in the first direction X may be 300 μm, 400 μm, 500 μm, or 600 μm, etc. A depth of the first laser processed region may be in a range from 3 μm to 6 μm. For example, the depth of the first laser processed region may be 3 μm, 4 μm, 5 μm, or 6 μm, etc.

In some embodiments, after the first laser processing, the initial first doped layer 210 uncovered by the first oxide layer 11 may be removed by using a first wet etching process, and a surface damage caused by the process of the laser processing may be removed by the first wet etching process. If the initial first tunneling layer 250 is formed in a previous step, the initial first tunneling layer 250 needs to be etched by the first wet etching process, and the remaining initial first tunneling layer 250 is used as the first tunneling layer 150. Specifically, a NaOH solution may be used for wet etching the initial first doped layer 210, and the remaining initial first doped layer 210 is used as the first doped layer 110. After the initial first doped layer 210 is patterned, an acidic solution may be used to etch the initial first tunneling layer 250 to form the first tunneling layer 150. Through the first wet etching process, an initial first sloped sidewall 211 may be formed on the sidewall of the first doped layer 110 facing the isolation region 103.

In some embodiments, a concentration of the NaOH solution for etching the initial first doped layer may be in a range from 1% to 5%. For example, the concentration of the NaOH solution for etching the initial first doped layer may be 1%, 2%, 3%, 4%, or 5%, etc.

In some embodiments, the process time of the first wet etching process may be in a range from 500 s to 1000 s. For example, the process time of the first wet etching process may be 500 s, 600 s, 700 s, 800 s, 900 s, or 1000 s, etc. If the process time of the first wet etching process is too long, the substrate 100 may be over-etched more, thus affecting the structure of the cell. If the process time of the first wet etching process is too short, the initial first doped layer 210 and the initial first tunneling layer 250 located in other areas may not be completely removed, thus affecting the normal performance of the cell. Therefore, a suitable range needs be selected for the process time of the first wet etching process. When the process time of the first wet etching process is in a range from 500 s to 1000 s, not only the initial first doped layer 210 and the initial first tunneling layer 250 in other areas can be removed, but also the substrate 100 can be prevented from being over-etched more.

Since it is not necessary to form a patterned mask layer on the initial first oxide layer 10 when the initial first oxide layer 10 is being patterned by the process of the first laser processing, the process flow may be simplified, so that the production efficiency is improved. After the initial first oxide layer 10 is patterned by the laser processing, the remaining initial first oxide layer 10 is used as the first oxide layer 11, and at this time the first oxide layer 11 can be used as a patterned mask layer. The initial first doped layer 210 may be etched by the first wet etching process, in which the first oxide layer 11 is used as a mask, and the remaining initial first doped layer 210 is used as the first doped layer 110. In such process steps, the first oxide layer 11 formed after patterning the initial first oxide layer 10 by the laser processing is directly used as the mask layer for the next etching step, thus avoiding the process steps of forming and removing the mask layer, further simplifying the process flow, improving the production efficiency, and reducing the production costs.

Figure 12:
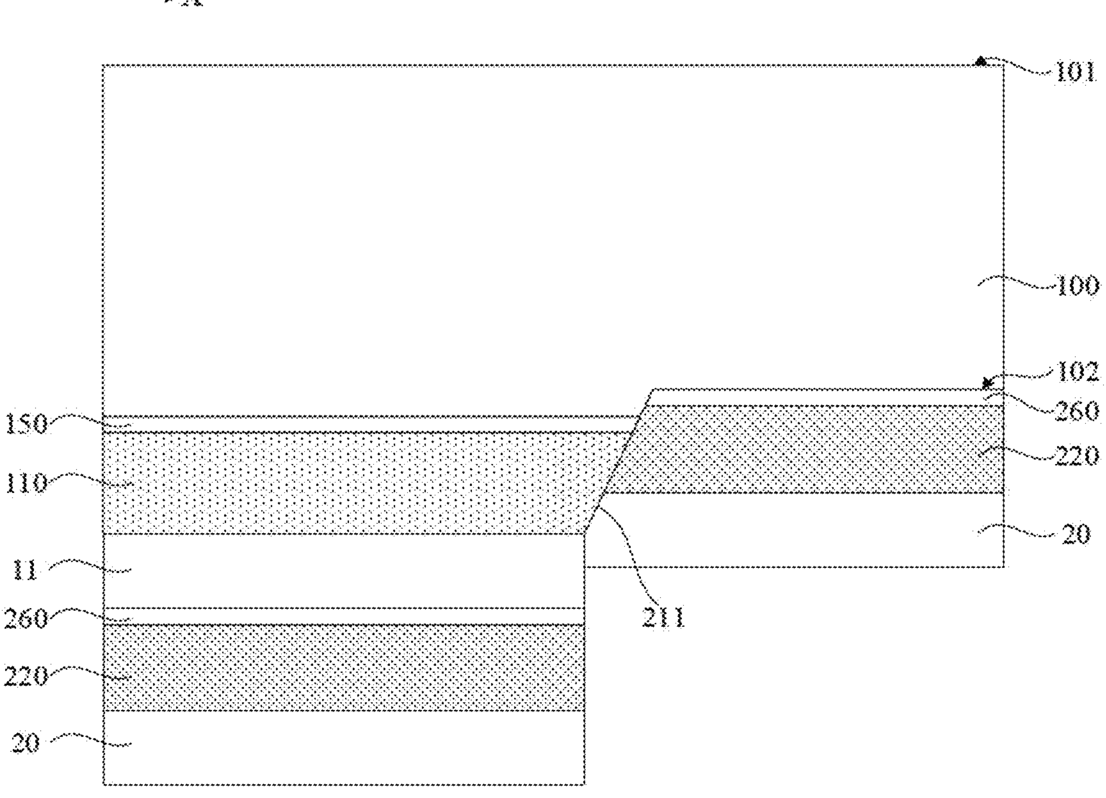

Referring to FIG. 12, an initial second doped layer 220 is formed on the back side 102 of the substrate 100, and a doping type of the initial second doped layer 220 is different from the doping type of the first doped layer 110.

Specifically, the substrate 100 is placed in a diffusion furnace, and the initial second doped layer 220 is formed by diffusion doping. A process temperature of the diffusion doping may be in a range from 700° C. to 1000° C., and a process time of the diffusion doping may be in a range from 1 hour to 3 hours. For example, the process temperature of the diffusion doping may be 700° C., 800° C., 900° C., or 1000° C., etc., and the process time of the diffusion doping may be 1 hour, 2 hours, or 3 hours, etc.

In some embodiments, the initial second doped layer 220 may be doped with phosphorus ions.

In some embodiments, before forming the initial second doped layer 220, an initial second tunneling layer 260 may be further formed on the back side 102 of the substrate 100. The initial second tunneling layer 260 covers at least part of the back side 102 of the substrate 100, and the initial second doped layer 220 covers a surface of the initial second tunneling layer 260 away from the substrate 100.

In some embodiments, in the step of forming the initial second doped layer 220, the initial second doped layer 220 is also located on the surface of the first doped layer 110. An initial second oxide layer 20 is also formed on the surface of the initial second doped layer 220 away from the back side 102 of the substrate 100. The initial second oxide layer 20 may be phosphorus silicon glass (PSG). A thickness of the initial second oxide layer 20 may be in a range from 100 nm to 200 nm. For example, the thickness of the initial second oxide layer 20 may be 100 nm, 150 nm, or 200 nm.

Figure 13:
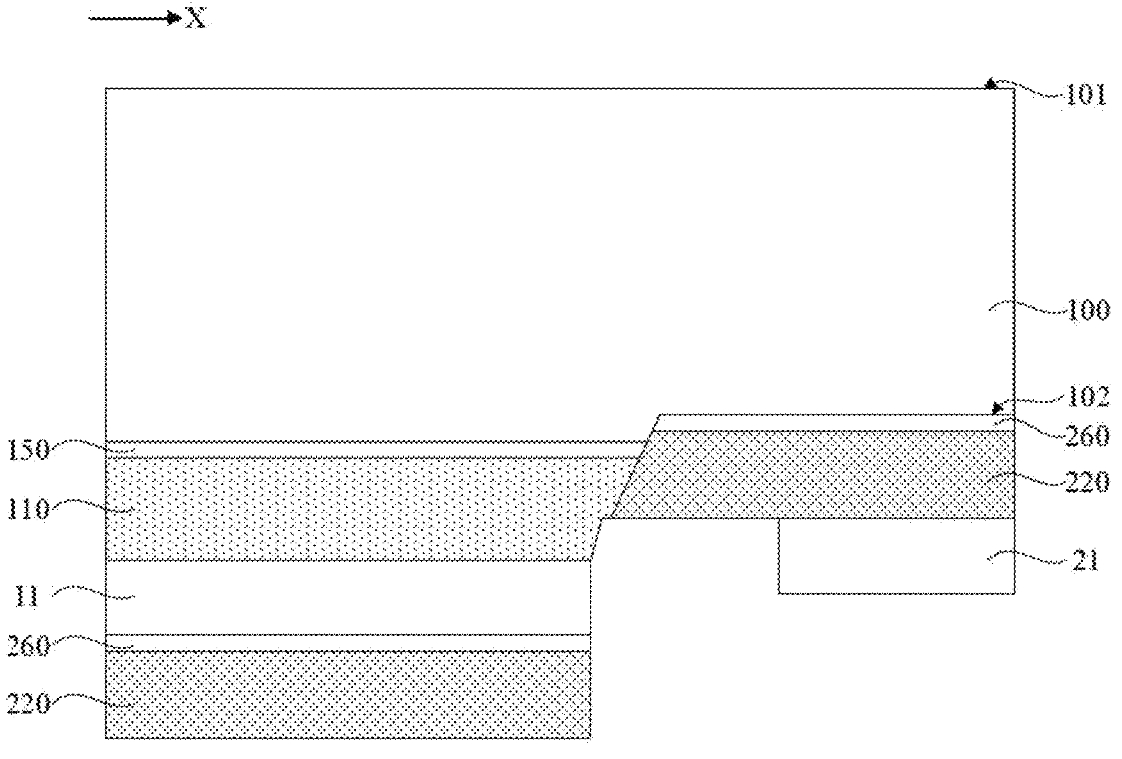

Referring to FIGS. 13 to 14, a second patterning process is performed on the initial second doped layer 220 to form a second doped layer 120. The first doped layer 110 and the second doped layer 120 are alternately arranged along the first direction X on the back side 102 of the substrate 100, the first doped layer 110 and the second doped layer 120 adjacent to the first doped layer are separated by the isolation region 103, and the portion of the back side 102 located at the isolation region 103 is exposed. The initial first sloped sidewall 211 is processed by the second patterning process to be the first sloped sidewall 111, and the first sloped sidewall 111 is the sidewall of the first doped layer 110 facing the isolation region 103, and the sidewall of the second doped layer 120 facing the isolation region 103 is the second sloped sidewall 121.

In some embodiments, the second patterning process may include following steps. Referring to FIG. 13, the second laser processing is performed to pattern the initial second oxide layer 20 to form a second oxide layer 21. The second oxide layer 21 allows at least the initial second doped layer 220 located at the isolation region 103 to be exposed. No slope on the sidewall of the second oxide layer 21 will be formed during the second laser processing, and the sidewall of the second oxide layer 21 is a vertical sidewall.

Since patterning the initial second doped layer 220 by using a laser processing will cause the property of the second doped layer 120 to be modified, thus affecting a normal performance of the cell. The laser processing can only pattern the initial second oxide layer 20, but cannot pattern the initial second doped layer 220.

The initial second oxide layer 20 formed in the previous step is also located on the first doped layer 110, and the initial second oxide layer 20 located on the first doped layer 110 may be removed by the second laser processing.

In some embodiments, the laser power of the second laser processing may be in a range from 20 W to 30 W. For example, the power of the second laser processing may be 20 W, 25 W, or 30 W, etc. If the laser power of the second laser processing is too high, not only a waste of energy may be caused, thus increasing the production costs, but also the property of the second doped layer 220 is modified, thus affecting the performance of the cell. If the laser power of the second laser processing is too low, the efficiency of patterning the initial second oxide layer 20 will be too low. Therefore, a suitable range needs to be selected for the laser power of the first laser processing. When the laser power of the second laser processing is in the range from 20 W to 30 W, not only the production costs will not increase, but also the property of the second doped layer can be prevented from being modified, and the production efficiency can be increased.

In some embodiments, a width (in the first direction X) of the second laser processing region may be in a range from 400 μm to 700 μm. For example, the width of the second laser processing region in the first direction X may be 400 μm, 500 μm, 600 μm, or 700 μm, etc.

If the distance between the surface of the first doped layer 110 away from the substrate 100 and the front side 101 of the substrate 100 is greater than the distance between the surface of the second doped layer 120 away from the substrate 100 and the front side 101 of the substrate 100 in the direction perpendicular to the back side 102 of the substrate 100, part of the first doped layer 110 may also be removed by the second laser processing, that is, the initial first slope sidewall 211 is also patterned.

Referring to FIG. 14, after the second laser processing, a second wet etching process may be performed to remove the initial second doped layer 220 un covered the second oxide layer 21. If an initial second tunneling layer 260 is formed in a previous step, the initial second tunneling layer 260 needs to be etched by the second wet etching process, and the remaining initial second tunneling layer 260 is used as the second tunneling layer 160. Specifically, a NaOH solution may be used for wet etching the initial second doped layer 220, and the remaining initial second doped layer 220 is used as the second doped layer 120. After the initial second doped layer 220 is patterned, the initial second tunneling layer 260 may also be etched by using an acidic solution to form the second tunneling layer 160. The second slope sidewall 121 on the sidewall of the second doped layer 120 facing the isolation region 103 may be formed by the second wet etching process, and part of the initial first slope sidewall 211 may also be etched by the second wet etching process.

In some embodiments, a concentration of the NaOH solution for etching the initial second doped layer may be in a range from 0.5% to 5%. For example, the concentration of the NaOH solution for etching the initial second doped layer may be 0.5%, 1%, 2%, 3%, 4%, or 5%, etc.

Continuing to refer to FIG. 14, in some embodiments, if the initial second doped layer 220 is also located on the first doped layer 110, the initial second doped layer 220 on the surface of the first doped layer 110, and the initial second tunneling layer 260 may be removed by the second wet etching process, and the remaining initial second tunneling layer 260 is used as the second tunneling layer 160.

In some embodiments, the process time of the second wet etching process may be in a range from 300 s to 800 s, and the process temperature of the second wet etching process may be in a range from 60° C. to 80° C. For example, the process time of the second wet etching process may be 300 s, 400 s, 500 s, 600 s, 700 s, or 800 s, etc., and the process temperature of the second wet etching process may be 60° C., 70° C., or 80° C., etc. In this way, not only the initial second doped layer 220 and the initial second tunneling layer 260 in other regions can be removed, but also more over-etching can be avoided, thereby avoiding reduction in the production efficiency.

Figures 15, 16:
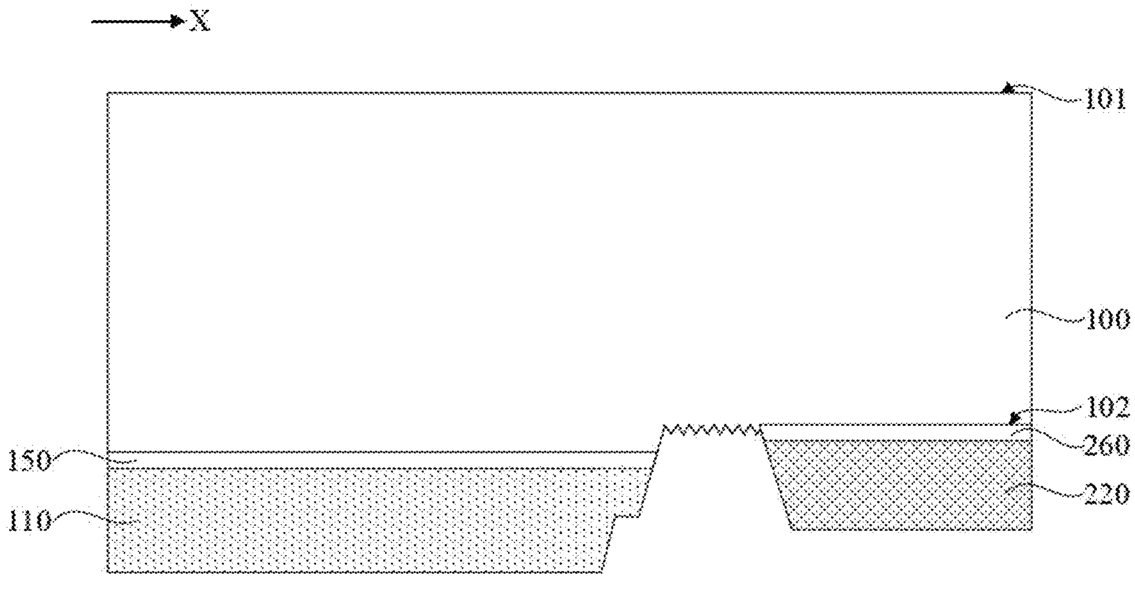
FIG. 16 shows an electron microscope image of a local area corresponding to a step of the method for manufacturing the solar cell according to an embodiment of the present disclosure.

Referring to FIG. 15, in some embodiments, before forming the first electrode 130 and the second electrode 140, the method may further include removing the first oxide layer 11 and the second oxide layer 21.

Figure 17:
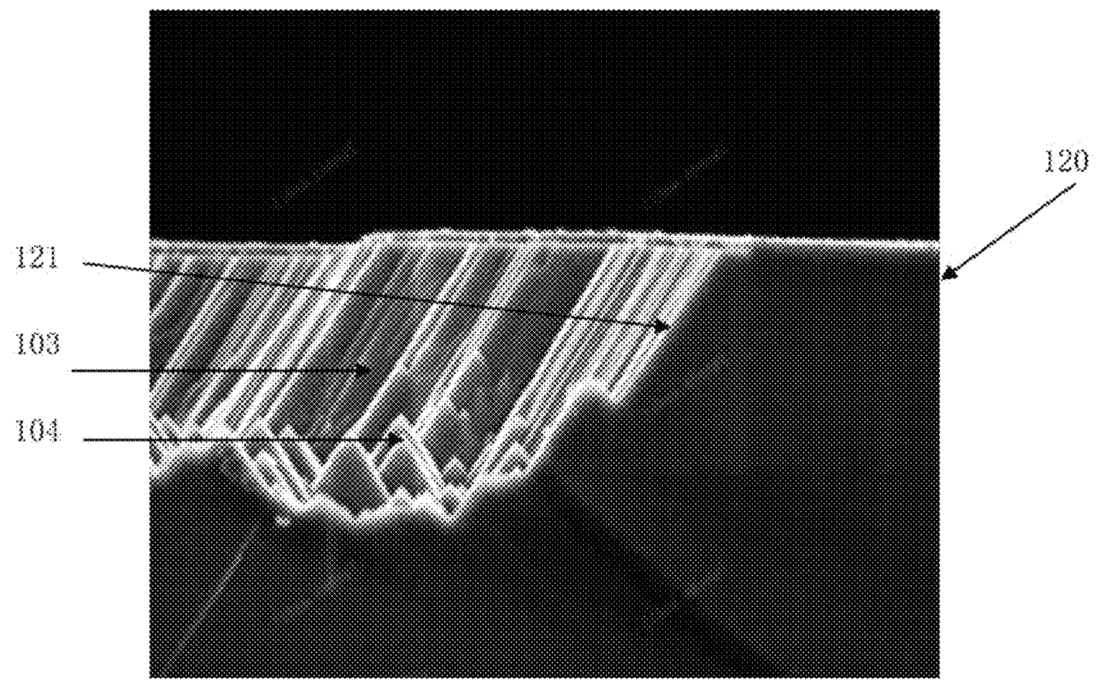
FIG. 17 shows an electron microscope image of another local area corresponding to a step of the method for manufacturing the solar cell according to an embodiment of the present disclosure.

FIG. 16 shows an electron microscope image of a local area after forming the first oxide layer and the second oxide layer according to the method for manufacturing the solar cell of an embodiment of the present disclosure, and FIG. 17 shows an electron microscope image of another local area after forming the first oxide layer and the second oxide layer according to the method for manufacturing the solar cell of an embodiment of the present disclosure.

Referring to FIG. 16, a protruding film layer on the right side of FIG. 16 is the first doped layer 110, and the isolation region 103 is on the left side. The surface of the isolation region 103 has the textured structure 104, and the sidewall of the first doped layer 110 facing the isolation region 103 is the first sloped sidewall 111, and the first sloped sidewall 111 includes the first sub-slope sidewall 1111, the platform surface 1112, and the second sub-slope sidewall 1113, which are connected in sequence. Referring to FIG. 17, a protruding film layer on the right side of FIG. 17 is the second doped layer 120, and the isolation region 103 is on the left side. The surface of the isolation region 103 has the textured structure 104, and the sidewall of the second doped layer 120 facing the isolation region 103 is the second sloped sidewall 121, and the second sloped sidewall 121 is a continuous slope.

Figure 18:
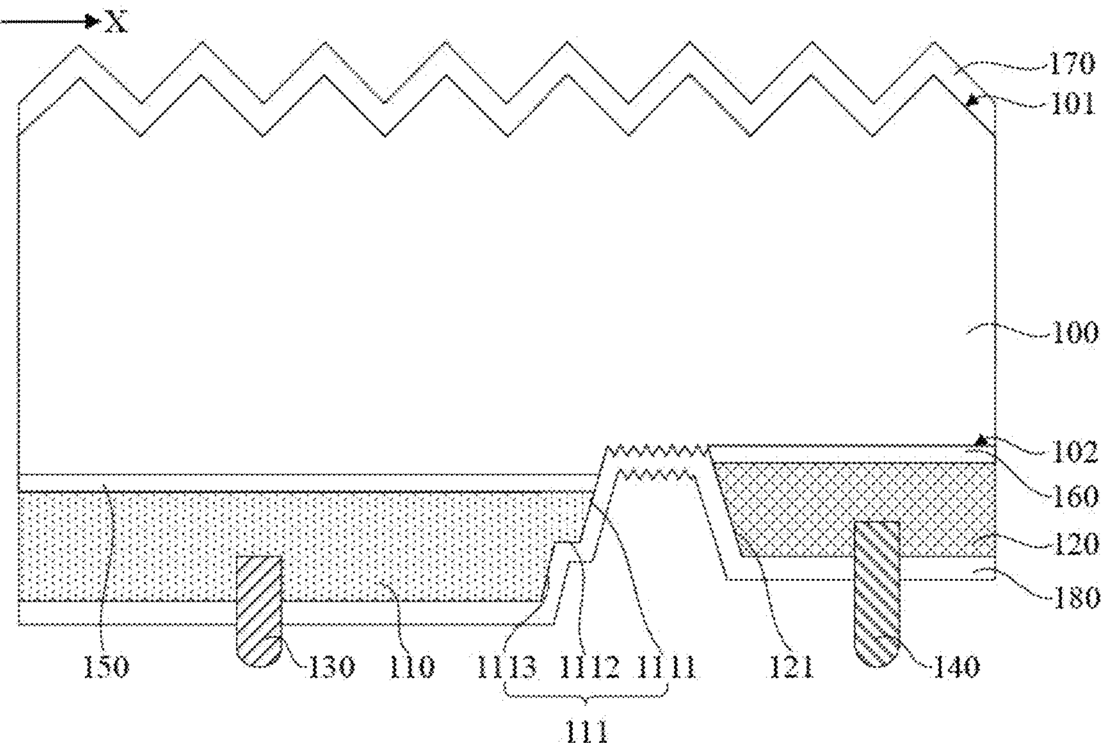
FIG. 18 is a schematic view showing a structure corresponding to a step of the method for manufacturing the solar cell according to an embodiment of the present disclosure.

Referring to FIG. 18, the first electrode 130 and the second electrode 140 are formed. The first electrode 130 is in electrical contact with the first doped layer 110, and the second electrode 140 is in electrical contact with the second doped layer 120.

In some embodiments, the first electrode 130 and the second electrode 140 may be formed by sintering a firing-through paste. The method of forming the first electrode 130 and the second electrode 140 may include: printing a metal paste using a screen-printing process. The metal paste may include at least one of silver, aluminum, copper, tin, gold, lead, or nickel.

In some embodiments, the metal paste contains materials with highly corrosive components. In this way, during the sintering process, the corrosive components will corrode some film layers of the cell, thereby causing the metal paste to penetrate into some regions of the cell.

Continuing to refer to FIG. 18, before forming the first electrode and the second electrode, the first passivation layer 170 and the second passivation layer 180 may be formed. The first passivation layer 170 may cover the surface of the front side 101 of the substrate 100, and the second passivation layer 180 may cover the back side 102 of the substrate 100, and covers the surfaces of the first doped layer 110 and the second doped layer 120 which are located on the back side 102 of the substrate 100. The electrodes in the solar cell penetrate the second passivation layer 180 to become in electrical contact with the first doped layer 110 or the second doped layer 120.

In the method for manufacturing the solar cell provided by the embodiment of the present disclosure, firstly, the substrate having the front side and the back side opposite to each other is provided, and then: the initial first doped layer is formed on the back side of the substrate; the first patterning process is performed on the initial first doped layer to form a plurality of first doped layers arranged at intervals along the first direction, and the sidewall of each first doped layer is the initial first slope sidewall; the initial second doped layer is formed on the back side of the substrate, and the doping type of the initial second doped layer is different from the doping type of the first doped layer; the second patterning process is performed on the initial second doped layer to form the second doped layer, and the first doped layer and the second doped layer are located on the back side of the substrate and are arranged alternately along the first direction, and the first doped layer and the second doped layer adjacent to the first doped layer are separated by the isolation region, and the portion of the back side located at the isolation region is exposed; the initial first slope sidewall, after being processed by the second patterning process, is the first slope sidewall, and the sidewall of the second doped layer facing the isolation region is the second slope sidewall; and the first electrode and the second electrode are formed, the first electrode is in electrical contact with the first doping region, and the second electrode is in electrical contact with the second doping region. In this way, in the manufactured solar cell, the first slope sidewall and the second slope sidewall enable more incident light rays to be reflected into the solar cell, thereby improving the light utilization rate of the solar cell and improving the efficiency of the cell.

Accordingly, another embodiment of the present disclosure further provides a photovoltaic module. The photovoltaic module provided by the embodiment of the present disclosure will be described in detail below in conjunction with the accompanying drawings. For the parts that are the same or correspond to the previous embodiment, refer to the corresponding description of the embodiments above, which will not be described repeatedly in detail hereinafter.

Figure 19:
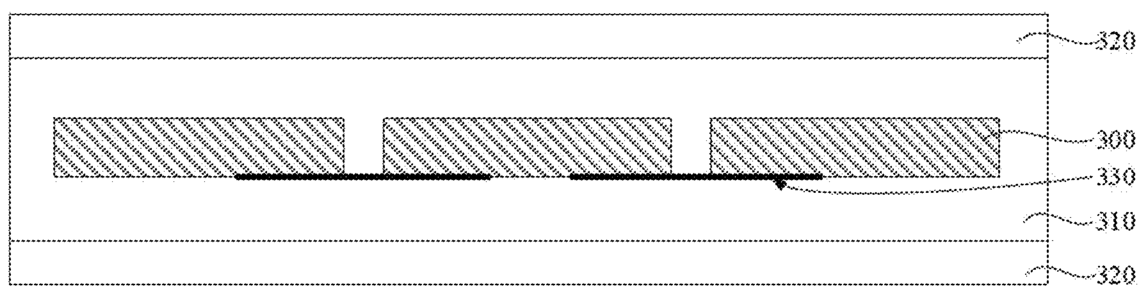
FIG. 19 is a schematic view showing a structure of a photovoltaic module according to an embodiment of the present disclosure.

FIG. 19 is a schematic view showing a structure of a photovoltaic module according to an embodiment of the present disclosure.

Referring to FIG. 19, the photovoltaic module includes a cell string, a packaging film 310, and a cover plate 320. The cell string is formed by electrically connecting a plurality of solar cells 300 above or a plurality of solar cells 300 manufactured by the manufacturing method for solar cell described in the above embodiments. The packaging film 310 is configured to cover a surface of the cell string. The cover plate 320 is configured to cover a surface of the packaging film 310 away from the cell string. Multiple cell strings are formed by the solar cells 300 in a manner of a whole cell or multiple cells electrically connected, and the multiple solar cells 300 are electrically connected in series and/or in parallel.

Specifically, in some embodiments, multiple cells may be electrically connected through conductive tapes 330. FIG. 19 only shows a positional relationship between the solar cells. That is, the electrodes of the same polarity in the cells are arranged in the same direction, or the electrodes of the positive polarity in the cells are arranged at the same side, so that each conductive tape 330 connects different sides of two adjacent cell s respectively. In some embodiments, multiple cells may also be arranged in the form of different polarities of any two adjacent cells being arranged at the same side, that is, the electrodes of adjacent multiple cells are arranged in the order of the first polarity, the second polarity, and the first polarity, etc., that is, the first polarity and the second polarity are alternately arranged, and each conductive tape connects the same side of two adjacent cells.

In some embodiments, no interval is arranged between the cells, that is, the cells may overlap each other.

In some embodiments, the encapsulation film 310 may include a first encapsulation layer and a second encapsulation layer. The first encapsulation layer covers one of a front side or a back side of a cell string, and the second encapsulation layer covers the other of the front side or the back side of the cell string. Specifically, at least one of the first encapsulation layer or the second encapsulation layer may be an organic encapsulation film, such as a polyvinyl butyral (PVB) film, an ethylene-vinyl acetate copolymer (EVA) film, a polyethylene octene co-elastomer (POE) film, or a polyethylene terephthalate (PET) film.

It should be understood that there is a boundary between the first encapsulation layer and the second encapsulation layer before lamination, but after a lamination process for forming the photovoltaic module, there is no concepts of the first and second encapsulation layers any longer, that is, the first encapsulation layer and the second encapsulation layer form an integral encapsulation layer 310.

In some embodiments, the cover plate 320 may be a glass cover plate, a plastic cover plate or the like with a light-transmitting function. Specifically, a surface of the cover plate 320 facing the encapsulation film 310 may be a concave-convex surface, thereby increasing the utilization rate of the incident light rays. The cover plate 320 includes a first cover plate and a second cover plate. The first cover plate is opposite to the first encapsulation layer, and the second cover plate is opposite to the second encapsulation layer.

It should be understood by those skilled in the art that the above-mentioned embodiments are specific examples for realizing the present disclosure, but in practical applications, various formal and detailed changes may be made to the embodiments without departing from the spirit and scope of the present disclosure. For any person skilled in the art, changes and modifications may be made without departing from the spirit and scope of the present disclosure, so the protection scope of the present disclosure shall be based on the scope the pending claims.

What is claimed is:

1. A solar cell, comprising:

a substrate having a front side and a back side opposite to each other;

a first doped layer and a second doped layer alternately arranged along a first direction on the back side; wherein the first doped layer and the second doped layer adjacent to the first doped layer are separated by an isolation region; a doping type of the first doped layer is different from a doping type of the second doped layer; a portion of the back side located at the isolation region is exposed; the first doped layer has a first slope sidewall facing the isolation region, and the second doped layer has a second slope sidewall facing the isolation region; and a first electrode and a second electrode, the first electrode being in electrical contact with the first doped layer, and the second electrode being in electrical contact with the second doped layer, wherein an angle between the first sloped sidewall and a surface of the first doped layer facing the back side is a first angle, and the first angle is an acute angle; and an angle between the second sloped sidewall and a surface of the second doped layer facing the back side is a second angle, and the second angle is an acute angle, and wherein the first angle is less than or equal to the second angle.

2. The solar cell according to claim 1, wherein the first angle is in a range from 25° to 60°, and the second angle is in a range from 30° to 65°.

3. The solar cell according to claim 1, wherein the portion of the back side uncovered by the isolation region has a textured structure, and the textured structure comprises a plurality of pyramid-shaped structures.

4. The solar cell according to claim 3, wherein, a width of a bottom surface of each pyramid-shaped structure in a direction parallel to the back side is in a range from 2 μm to 4 μm.

5. The solar cell according to claim 1, wherein in a direction away from the back side of the substrate, the first slope sidewall comprises a first sub-slope sidewall, a platform surface, and a second sub-slope sidewall connected in sequence.

6. The solar cell according to claim 5, wherein in a direction perpendicular to the back side of the substrate, a distance between a surface of the first doped layer away from the substrate and the front side of the substrate is greater than a distance between a surface of the second doped layer away from the substrate and the front side of the substrate, and the platform surface is closer to the back side than the surface of the second doped layer away from the substrate is.

7. The solar cell according to claim 5, wherein in a direction perpendicular to the back side of the substrate, a thickness of the second sub-slope sidewall is less than a thickness of the first sub-slope sidewall.

8. The solar cell according to claim 5, wherein a slope of the second sub-slope sidewall relative to the back side is greater than a slope of the first sub-slope sidewall relative to the back side.

9. The solar cell according to claim 1, wherein in a direction perpendicular to the back side of the substrate, a distance between a surface of the first doped layer away from the substrate and the front side of the substrate is less than or equal to a distance between a surface of the second doped layer away from the substrate and the front side of the substrate.

10. The solar cell according to claim 1, wherein the first sloped sidewall is a continuous slope.

11. The solar cell according to claim 1, wherein the second sloped sidewall is a continuous slope.

12. The solar cell according to claim 1, wherein a doping ion in the first doped layer comprises a boron ion, and a doping ion in the second doped layer comprises a phosphorus ion.

13. The solar cell according to claim 6, wherein in a direction perpendicular to the back side of the substrate, a thickness of the second sub-slope sidewall is less than a thickness of the first sub-slope sidewall.

14. The solar cell according to claim 6, wherein a slope of the second sub-slope sidewall relative to the back side is greater than a slope of the first sub-slope sidewall relative to the back side.

15. The solar cell according to claim 1, wherein the substrate is an N-type semiconductor substrate or a P-type semiconductor substrate.

16. A photovoltaic module, comprising:

a cell string formed by electrically connecting a plurality of solar cells of claim 1;

a packaging film configured to cover a surface of the cell string; and a cover plate configured to cover a surface of the packaging film away from the cell string.

17. The photovoltaic module according to claim 16, wherein the plurality of solar cells electrically connected in series or in parallel.

18. The photovoltaic module according to claim 16, wherein the plurality of solar cells are electrically connected through conductive tapes.

* * * * *